United States Patent [19]

Hsu

[11] 3,946,327
[45] Mar. 23, 1976

[54] AMPLIFIER EMPLOYING COMPLEMENTARY FIELD-EFFECT TRANSISTORS

[75] Inventor: Sheng Teng Hsu, Lawrenceville, N.J.

[73] Assignee: RCA Corporation, New York, N.Y.

[22] Filed: Oct. 23, 1974

[21] Appl. No.: 517,239

[52] U.S. Cl. .................. 330/35; 307/304; 330/13; 330/18; 330/22
[51] Int. Cl.² ...................................... H03F 3/16
[58] Field of Search ...... 307/205, 214, 304; 330/13, 330/18, 19, 22, 35

[56] References Cited
UNITED STATES PATENTS

| | | | |
|---|---|---|---|
| 3,365,834 | 1/1975 | Gehweiler | 330/13 |
| 3,872,390 | 3/1975 | Nash | 330/13 |

*Primary Examiner*—R. V. Rolinec
*Assistant Examiner*—Lawrence J. Dahl
*Attorney, Agent, or Firm*—H. Christoffersen; S. Cohen; R. G. Coalter

[57] ABSTRACT

Separate nonlinear load elements connected between the output terminal and each operating potential terminal of a complementary field-effect transistor amplifier determine the amplifier voltage gain and render it insensitive to variations in the operating potentials. The load elements may comprise other field-effect transistors whereby the effective amplifier gain is determined in accordance with a transconductance ratio. The transconductance ratio may be specified in terms of easily manipulated device parameters such as channel width-to-length ratios of the various transistors.

10 Claims, 10 Drawing Figures

AMPLIFIER EMPLOYING COMPLEMENTARY FIELD-EFFECT TRANSISTORS

The invention herein described was made in the course of or under a contract with the Department of the Air Force.

This invention relates to amplifiers and particularly to amplifiers of the kind employing complementary field-effect transistors.

Complementary field-effect transistor (FET) amplifiers are widely used in digital switching applications where they offer numerous advantages over other logic families such as improved fan-out, higher noise immunity and reduced quiescent power dissipation.

Such amplifiers have not, however, heretofore found wide acceptance in analog circuit applications. One reason for this is that the transconductance, gm, of the complementary transistors (and thus of the amplifier) is sensitive to variations in the operating potentials (power supply voltage) applied to the amplifier circuit. For a given load resistance, $R_L$, this results in undesirable gain changes as the operating potential changes since the circuit gain is proportional to the product of the load resistance and the amplifier transconductance.

Gain sensitivity of this kind results in cross modulation of the input signal and the power supply potential variations which causes distortion and the production of unwanted modulation products. But even if the modulation products (sum and difference) fall outside the frequency band of interest, the gain variation and the distortion may be incompatible with amplitude sensitive devices that the amplifier may be used with.

Negative feedback techniques are known which can effectively cancel this unwanted gain variation but these suffer one or more disadvantages. For example, proper application of negative feedback signal to the amplifier input terminal can result in stabilized voltage gain but at the expense of degraded input impedance. Application of negative feedback signals at the source terminals of the transistors requires the inclusion of one or more resistors and reduces the signal dynamic range by the amount of the potential drop thereacross. In the amplifier of the present invention, input impedance and signal dynamic range are not degraded.

In accordance with one aspect of the present invention, an amplifier having a transconductance which varies in a given sense as the operating potential supplied thereto varies is loaded by a nonlinear circuit having a parameter which determines the amplifier voltage gain and which changes as the operating potential changes in a sense to maintain the voltage gain substantially constant. In accordance with another aspect of the invention, separate nonlinear load elements connected between the output terminal and each operating potential terminal of a complementary field-effect transistor amplifier determine the amplifier voltage gain and render it insensitive to variations in the operating potentials. The load elements may comprise other field-effect transistors so that the effective amplifier gain is determined in accordance with a transconductance ratio. The transconductance ratio may be specified in terms of easily manipulated device parameters such as the channel width-to-length ratios of the various transistors.

The invention is illustrated in the accompanying drawings wherein like reference numbers designate like elements and in which.

Figure 1:
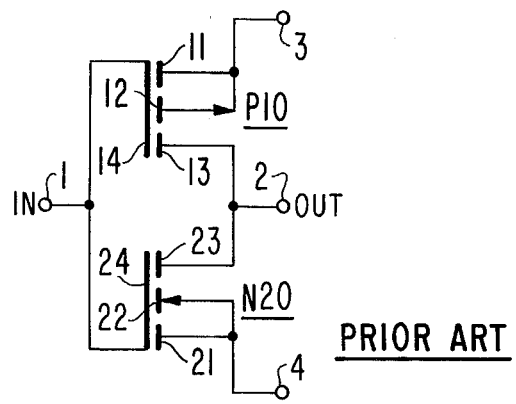
FIG. 1 is a circuit diagram of a prior art complementary field-effect transistor amplifier.

In the prior art complementary field-effect transistor (FET) amplifier of FIG. 1, terminal 1 is an input terminal for receiving an input signal to be amplified and terminal 2 is an output terminal for producing an amplified output signal. Terminals 3 and 4 are operating potential terminals for connection to a source of direct current operating potential with terminal 3 maintained at a potential more positive than that applied to terminal 4. P-channel enhancement-mode field-effect transistor P10 is connected at its source 11 and substrate 12 to terminal 3 and at its drain 13 and gate 14 to terminals 2 and 1, respectively. N-channel enhancement mode field-effect transistor N20 is connected at its source 21 and substrate 22 to terminal 4 and at its drain 23 and gate 24 to terminals 2 and 1, respectively.

Customarily, transistors P10 and N20 are selected to have "matched" characteristics (i.e., similar values of transconductance, drain-to-source conductance, and so forth) under equal bias conditions. Equal bias conditions are obtained by quiescently biasing input terminal 1 midway between the potentials of terminals 3 and 4. In the quiescent condition of the circuit, the potential of the output terminal will be substantially equal to that of the input terminal. Deviation in either sense of the input signal from its quiescent value will result in a complementary variation of the drain-to-source conductances of the transistors in a sense and by an amount to produce an inverted and amplified replica of the input signal at output terminal 2.

The transconductance of the amplifier of FIG. 1 is given by the sum of the transconductances of the individual transistors. Its output impedance (assuming a no-load condition) is given by the reciprocal of the sum of the drain-to-source conductances of the transistors. The amplifier voltage gain, therefore, is given by the product of the sum of the transconductances multiplied by the reciprocal of the sum of the drain-to-source conductances. The maximum output signal linear dynamic range is dependent primarily upon the direct current operating potential (applied to terminals 3 and 4) and the sum of the transistor threshold voltages. Assuming constant threshold voltages, the output signal dynamic range will increase for increasing values of the operating potential.

The maximum linear input signal range is also dependent upon the operating potential and threshold voltages and is additionally related to the amplifier voltage gain. For example, for fixed values of the threshold voltages and the operating potential, an increase in voltage gain will necessarily result in a reduced input signal range for linear operation. The operating potential, however, may not, in practical applications, be a fixed quantity but may vary over a relatively large range of values. In the ideal case, where the amplifier voltage gain is independent of its operating potential, both the input and output signal ranges will increase for increasing values of the operating potential. The prior art amplifier, however, is far from ideal. Its transconductance, output conductance, input/output signal ranges, signal bandwidth and voltage gain are all sensitive to variations in the direct current operating potential supplied to terminals 3 and 4. The interrelationships between the device parameters and the environmental and circuit operating parameters which result in this sensitivity are not altogether simple but may be understood by consideration of a specific example with certain simplifying assumptions.

Assume that a separate load conductance (not shown) is connected between output terminal 2 and each of the operating potential terminals, that terminal 4 is connected to ground, that terminal 3 is connected to a positive voltage source which may be varied and that terminal 1 is quiescently biased at half the potential of terminal 3. Assume next that the load conductances are equal, linear and that the sum thereof, $G_L$, is substantially greater than the sum, $G_A$, of the drain-to-source conductances of transistors 10 and 20 over the full range of desired linear output signal variations.

Under these assumptions, one of the principal amplifier variables, $G_A$, has been eliminated so that the amplifier output impedance is constant (independent of the supply voltage) and given by the reciprocal of the total load conductance, $G_L$. The other principal amplifier variable, its transconductance (gm) and its effect upon circuit operation as the supply voltage varies may now be examined.

The amplifier transconductance, as previously mentioned, is equal to the sum of the transconductances of the individual transistors. The transconductance of an insulated gate enhancement mode field effect transistor operating in the saturation region may be usefully approximated by the following well known equation:

$$gm = \frac{\mu \epsilon_{ox} \epsilon_0 W}{tox\, L} |V_g - V_t| \qquad (1)$$

where:
$V_g$ = gate-to-source voltage
$V_t$ = threshold voltage
W/L = channel width to length ratio
$\epsilon_0$ = dielectric constant of free space
$\epsilon_{ox}$ = relative dielectric constant of gate oxide
tox = gate oxide thickness
$\mu$ = mobility The principal circuit (as opposed to device) variable in equation 1 is the gate-to-source voltage $V_g$. In the prior art amplifier, $V_g$ of both transistors increases as the operating potential increases thus it is clear that under the given assumptions, the voltage gain of the amplifier must also increase. It is also to be noted from equation 1 that the transconductance may be varied by selection of the channel width-to-length ratio, W/L. This ratio is an easily manipulated device parameter and is used to advantage in accordance with one aspect of the present invention in a manner to be subsequently described.

The conclusion above that the gain of the prior art amplifier will increase for increasing values of the supply voltage, is valid for the assumed linear load conductance, $G_L$, substantially greater than the total drain-to-source conductance, $G_A$. In the absence of this assumption, the voltage gain would be influenced by variations in $G_A$ at different values of the supply voltage. An exact quantitative expression for the drain-to-source conductance, Gds, of an enhancement mode field-effect transistor operating in the saturation region is not known, but useful approximations thereof in reasonable agreement with observed data have been presented in the literature. See, for example: V. G. K. Reddi and C. T. Sah, "Source-to-drain Resistance Beyond Pinch-off in MOS Transistors," I.E.E.E. Trans. Electron Devices, Vol. ED-12, pp. 139–141, March 1965, and D. Frohman-Bentchkowsky and A. S. Grove, "Conductance of MOS Transistors in Saturation" I.E.E.E. Trans. Electron Devices, Vol. ED-16, pp. 108–113, Jan. 1969.

From the references it may be seen that Gds is a higher ordered function involving several more variables than gm. Qualitatively, three aspects of this function relevant to the present discussion are: (1) Gds of each transistor in the prior art amplifier increases as the supply voltage increases, (2) Gds, typically, over the region of interest, increases at a faster rate than gm and (3) Gds is substantially less than gm for a typical device. The significance of these aspects as it relates to the prior art amplifier are as follows. As noted, the (unloaded) amplifier voltage gain is directly related to gm and inversely related to Gds. Since the rate of change of Gds as the supply voltage changes exceeds that of gm, one would expect that the unloaded prior art amplifier voltage gain would decrease as the supply voltage increases and this effect has been observed in commercially available complementary FET amplifiers.

From the foregoing it may be concluded that the supply voltage sensitivity of the voltage gain of the prior art amplifier is dependent upon the relative magnitudes of the load conductance (if any) and the total drain-to-source conductance of transistors 10 and 20. There are three possibilities. First, under no load conditions the voltage gain will decrease for increasing supply potentials. Second, for a linear load conductance substantially greater than the total drain-to-source conductance, the voltage gain will increase as the supply potential increases. Third, values of a linear load conductance and drain to source conductance can be found such that the derivative of the voltage gain versus the supply voltage variation within a linear operating range can be zero at a single point. This latter case, however, is of little practical significance where it is expected that the supply voltage may vary substantially.

Figure 2:
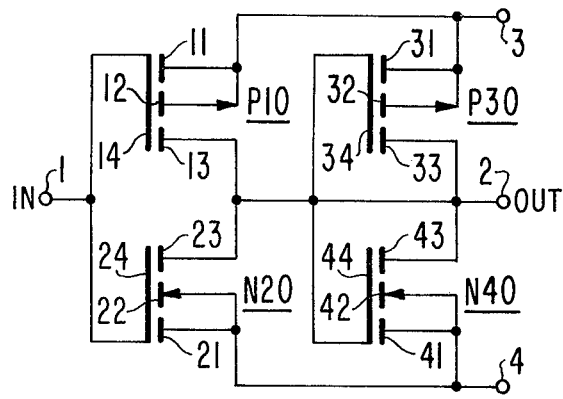
FIG. 2 is a circuit diagram of an amplifier in accordance with the invention.

In the embodiment of the invention shown in FIG. 2 variations in the relatively complex variable Gds have little effect upon circuit operation, the rate of change of the voltage gain with respect to operating potential variations is minimal over a substantial operating range, and the magnitude of the voltage gain is determined in accordance with certain ratios of the transconductances of the four transistors which comprise the amplifier. Additionally, voltage gains, less than, equal to or greater than unity may be achieved without instability. Also, both the input and output signal ranges for linear operation increase for increasing values of the supply voltage.

In FIG. 2 transistors P10 and N20 are connected to terminals 1–4 as previously described. An additional P-channel enhancement-mode field-effect transistor P30 is connected at its source 31 and substrate 32 to operating potential terminal 3 and at its drain 33 and gate 34 to output terminal 2. A further N-channel enhancement-mode field-effect transistor N40 is connected at its source 41 and substrate 42 to operating potential terminal 4 and at its gate 44 and drain 43 to output terminal 2.

For the purposes of the following discussion, the term "driver transistors" will refer to all transistors which are connected at their gates to the circuit signal input terminal (P10, N20 in FIG. 2). The terms "load," "load resistors" and "load transistors" will refer to all load devices (other than driver transistors) which are connected between the circuit output terminal and each of the circuit operating potential (power supply) terminals. "Driver transconductance" denoted by gm(d) will designate the sum of the transconductances of the driver transistors. "Driver conductance" denoted by G(d) will refer to the sum of the drain-to-source conductances of all driver transistors. "Load conductance," G(1), will designate the sum of the conductances of all load devices but will not include the driver conductance. It will initially be assumed that the driver conductance, G(d) is substantially greater than the driver susceptance, B(d) (i.e., that the driver admittance, Y(d), is predominantly real). Similarly, the load conductance, G(L), will initially be assumed substantially greater than the load susceptance, B(L). "Load transconductance," gm(1), will designate the sum of the transconductances of the load transistors.

In operation, input terminal 1 is quiescently biased at a potential midway between the operating potentials applied to terminals 3 and 4 as in the prior art amplifier. This may be accomplished in several different ways. Where the input terminal is directly coupled to a preceeding stage, for example, the operating potentials applied to terminals 3 and 4 may be made equally more positive and more negative, respectively, than the quiescent output voltage level of the preceeding stage. Where the amplifier is to be used with capacitive transducers or where capacitive coupling is otherwise desired (such as for level shifting or providing high pass filtering) the amplifier may be remotely biased or self-biased using known techniques. The magnitude of the potential difference between terminals 3 and 4 is greater than the sum of the threshold voltages of transistors P10 and N20 (or P30 and N40, whichever is the larger) so that under the quiescent bias condition and throughout their linear operating regions, all four transistors are operating in their saturation regions.

The transconductance is much greater than the drain-to-source conductance in typical commercially available field-effect transistors. In the RCA Corporation type CD4007A transistor array, for example, the transconductance of a P or N channel device may be two or more orders of magnitude greater than its corresponding drain-to-source conductance in the saturation region. The effect of this relationship is that the drain-to-source conductances of transistors P10, N20, P30 and N40 may be neglected so that the voltage gain of the amplifier of FIG. 2 may be approximated by the following expression:

$$Av \approx -gm(d)/gm(1) \qquad (2)$$

It should be noted that the relatively complex function Gds, which is of great significance to the operation of the prior art amplifier, does not appear in equation 2. The voltage gain of the present amplifier, in other words, is dependent principally upon a ratio of the driver and load transconductances and this relatively simple relationship results in numerous design and operational advantages.

These advantages may be appreciated by substitution of equation 1 into equation 2 in accordance with the definitions previously given. Under the quiescent bias condition assumed, the term $|V_g-V_t|$ appears in both numerator and denominator and thus may be neglected. The terms $\epsilon$ ox, $\epsilon$ o, tox and $\mu$ may also be neglected if it is assumed that the P and N channel driver transistors are "matched" and that the P and N channel load transistors are also "matched". The term "matched" as used here means that the transconductance of transistor P10 is substantially equal to that of transistor N20 and that the transconductance of transistor P30 is substantially equal to that of transistor N40. Equation 2 may then be expressed in terms of the two easily controlled device variables previously discussed. Specifically, at the quiescent bias condition:

$$Av \approx -\frac{W/L(P10)}{W/L(P30)} \text{ or } -\frac{W/L(N20)}{W/L(N40)} \qquad (3)$$

In other words, under these conditions the voltage gain is given by the ratio of the length-to-width ratios of the P-channel driver and load transistors or that of the N-channel driver and load transistors.

Two aspects of equation 3 should be noted. First, the equation is independent of the operating potentials applied to terminals 3 and 4 so that the amplifier voltage gain is not sensitive to variations thereof. Second, the amplifier voltage gain may be made less than, equal to or greater than unity by either of two relatively simple design techniques. For example, one may vary the length-to-width ratios of the driver or load devices to achieve the desired voltage gain, or in the alternative one may parallel connect additional transistors to the driver or load. An example of this latter approach is given in FIGS. 7–9 and will be discussed subsequently.

A further aspect of the amplifier of FIG. 2 is that its output impedance (under the assumptions given) is principally determined by the reciprocal of the sum of the transconductances of the load transistors (P30, N40). This function is dependent upon $V_g$ (see equation 1) and thus upon the operating potential and decreases as the operating potential increases. If the amplifier is supplying an output signal to a reactive load it is apparent that the output signal rise time, $t_r$, for a step function input will decrease as the operating potential increases. This effect cannot be achieved in amplifiers having constant output impedance and constant gain and represents a unique advantage of the present amplifier when operating with a reactive load to function as a voltage controlled variable bandwidth amplifier. Such an amplifier is illustrated in FIG. 3 which is seen to comprise the amplifier of FIG. 2 having first and second capacitors, 50 and 60 respectively, connected between output terminal 2 and operating potential terminals 3 and 4, respectively.

Figure 3:
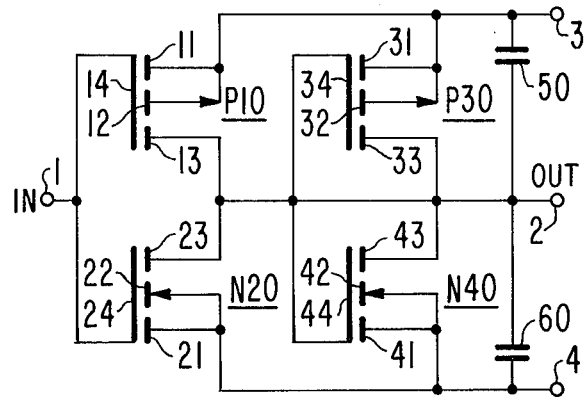
FIG. 3 is a circuit diagram of a voltage controlled variable bandwidth amplifier embodying the invention.

In FIG. 3, transistors, P10, N20, P30 and N40 operate as previously described. The half power bandwidth of the amplifier of FIG. 3 extends to the frequency at which the load transconductance (previously defined) is equal to the load susceptance, $B_L$, (here defined as the sum of all reactances connected between output terminal 2 and either or both of the operating potential terminals). The total load capacitance is fixed and thus independent of frequency but the load transconductance increases (and therefore the bandwidth increases) with increasing values of the operating potential across terminals 3 and 4.

Figure 4:
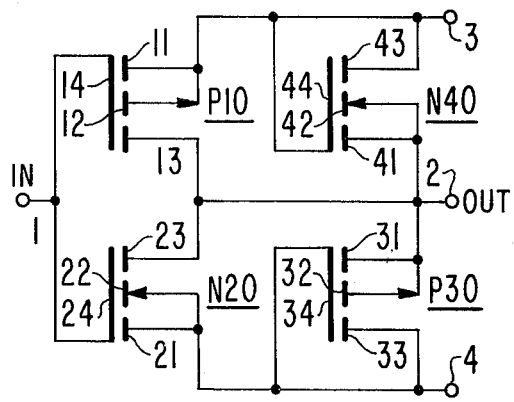
FIGS. 4-9 are circuit diagrams showing modifications of the amplifier of FIG. 2.
Figure 5:
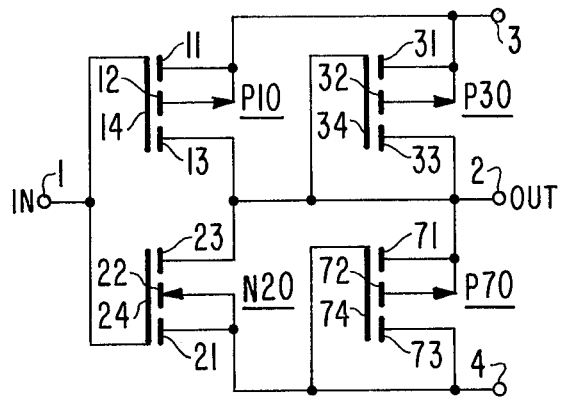
Figure 6:
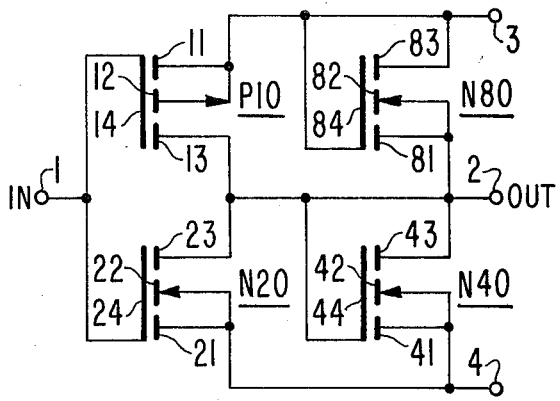

The amplifiers of FIGS. 4, 5 and 6 operate in the manner of that of FIG. 2 but differ structurally in the connections and conductivity type of their load transistors. In FIG. 4 complementary load transistors P30 and N40 have been interchanged so that their substrates and sources (31, 32, 41, 42) are connected to output terminal 2. Terminal 4 is connected to the gate 34 and drain 33 of transistor P30 and terminal 5 is connected to the gate 43 and drain 44 of transistor N40. In FIG. 5, transistor N40 of FIG. 2 has been replaced by a P-channel enhancement-mode field-effect transistor P70. The source 71 and substrate 72 thereof are connected to terminal 2 and the gate 74 and drain 73 thereof are connected to terminal 4. In this configuration, the load transistors (P30, P70) are non-complementary. The embodiment of FIG. 6 also employs non-complementary load transistors but of the opposite type as those of FIG. 5. In FIG. 6 transistor P30 of FIG. 2 has been replaced by an N channel enhancement-mode field-effect transistor N80 connected at its source 81 and substrate 82 to output terminal 2 and at its gate 84 and drain 83 to operating potential terminal 3.

As previously mentioned, the voltage gain of the amplifier of the present invention may be set to a desired value either by appropriate selection of the width-to-length ratios of the driver and load transistors or, where it is more convenient, by parallel connecting further transistors to function as either driver or load devices. Paralleling additional driver transistors results in increased voltage gain while paralleling additional load transistors results in decreased voltage gain. Adding both load and driver transistors can result in decreased output impedance with no change in voltage gain. These aspects of the invention are illustrated in FIGS. 7, 8, and 9, respectively.

Figure 7:
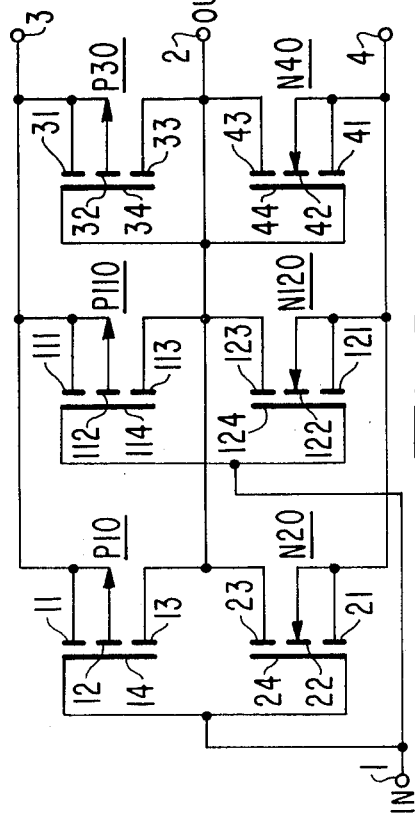

In FIG. 7 an additional pair of complementary driver transistors P110 and N120 are added in parallel with the driver transistors P10 and N20 of the amplifier of FIG. 2. The source 111 and substrate 112 of P-channel enhancement mode field effect transistor P110 are each connected to operating potential terminal 3. The source 121 and substrate 122 of N-channel enhancement mode field effect transistor N120 are each connected to operating potential terminal 4. The drain electrodes, 113 and 123, of both transistors are connected to output terminal 2 and their gate electrodes, 114 and 124, are each connected to input terminal 1.

The voltage gain of the amplifier of FIG. 7 will be substantially equal to the sum of the transconductance of transistors P10, N20, P110 and N120 divided by the sum of the transconductances of transistors P30 and N40 (see equation 2). If all transistors are of substantially equal transconductance the voltage gain will, therefore, be nominally 6dB over a wide range of operating potential variations. This has been verified experimentally by connecting the six transistors of the RCA type CD-4007A transistor array in the manner of FIG. 7. The voltage gain measured over a range of operating potentials from about 2.5 to 7.5 volts evidenced no significant variation from the expected value of 6dB up to a test frequency of nominally 50 kHz. Higher frequency tests were not made as 50 kHz is the nominal maximum operating frequency for the particular wave analyzer employed. For 10 kHz output signal levels of 30, 100 and 300mV the third harmonic distortion was unmeasurable with the available equipment and the second harmonic was less than 0.1 percent. This low value of distortion is not attainable in a resistively loaded complementary field-effect transistor amplifier because the transistors are essentially "square law" devices. In the present invention, however, nonlinearities in the driver transistors are effectively cancelled by the nonlinearities in the load transistors, whereby linear amplification results as seen by the test results.

Figure 8:
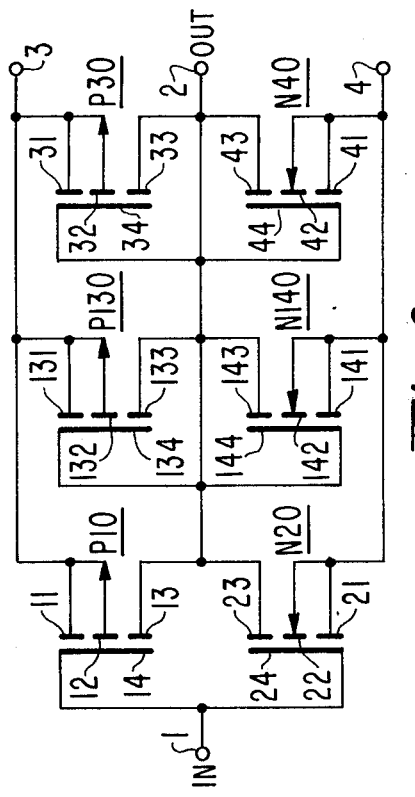
Figure 9:
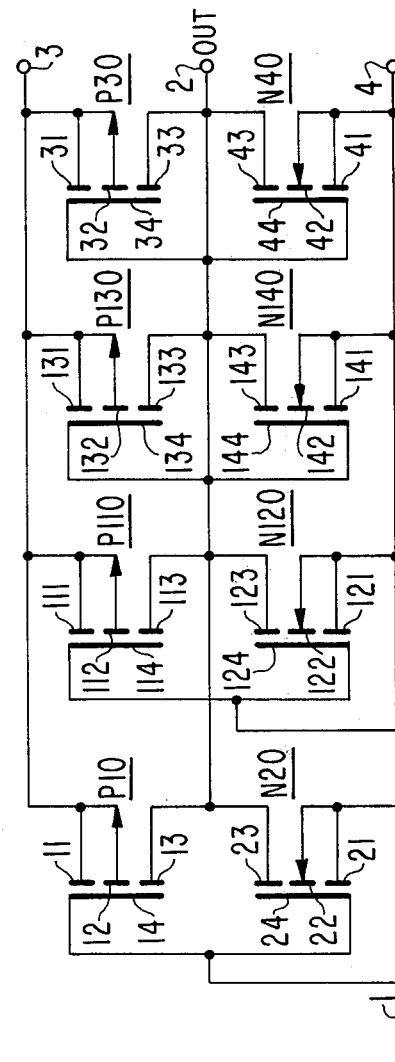

The amplifier of FIG. 8 is similar to that of FIG. 2 but includes a further pair of complementary load transistors P130 and N140. The source 131 and substrate 132 of P-channel enhancement mode field effect transistor P130 are each connected to operating potential terminal 3 and the gate 134 and drain 133 thereof are each connected to output terminal 2. The source 141 and substrate 142 of N-channel enhancement mode field effect transistor N140 are each connected to operating potential terminal 4 and the drain 143 and gate 144 thereof are each connected to output terminal 2.

Operation of the amplifier of FIG. 8 is substantially the same as that of FIG. 2. The additional parallel connected load transistors increase the total load transconductance thus providing a lower output impedance. Further, if all the transistors have equal values of transconductance, the voltage gain will be nominally −6dB. Such an amplifier is particularly useful for driving low impedance, low level lines from high impedance, high level sources.

In the amplifier of FIG. 9, additional transistors P110, N120, P130 and N140 (which are connected as described in FIGS. 7 and 8) are added to the amplifier of FIG. 2. Where the transconductances of all eight transistors are substantially equal, the voltage gain will be minus unity and the output impedance will be equal to the reciprocal of the sum of the transconductances of transistors P130, N140, P30 and N40. This amplifier is, therefore, useful for unity gain inversion and driving low impedance lines from a high impedance source.

Figure 10:
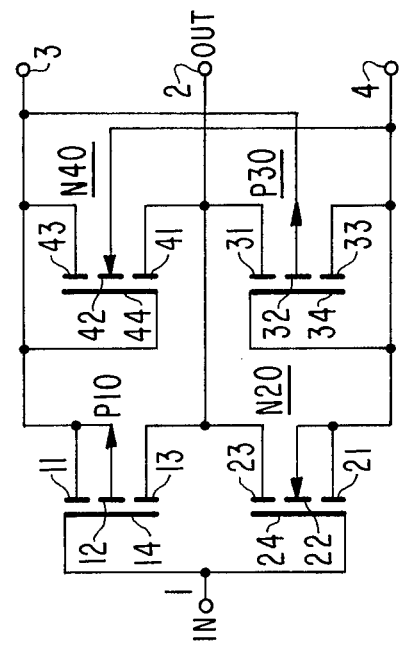
FIG. 10 is a circuit diagram illustrating a modification of the amplifier of FIG. 4 for receiving back gate bias.

The amplifier of FIG. 10 is similar to that of FIG. 4 except that the substrate 32 of transistor P30 is connected to terminal 3 and the substrate 42 of transistor N40 is connected to terminal 4. In effect, the substrates now serve as "back gates" for transistors P30 and N40 which receive bias of a sense to decrease the transconductance of both transistors thus increasing the voltage gain of the amplifier (i.e., here it is the load, not the driver, transconductance which is decreased, hence the increase in voltage gain). The application of "back gate bias" is, therefore, another method of adjusting the gain of the amplifier of the present invention at least in those applications where separate connections can conveniently be made to the transistor substrates. Back gate bias could be applied to the transistors of FIG. 2 (either the driver pair, the source pair or both) by connecting the substrates of the P-channel devices to a point more positive than terminal 3 and those of the N-channel devices to a point more negative than terminal 4.

What is claimed is:
1. In an amplifier of the kind comprising a first terminal for receiving an input signal, a second terminal for providing an output signal, third and fourth terminals for receiving a direct current operating potential thereacross, first and second complementary field effect transistors, each transistor having source, gate and drain electrodes, the source electrodes of said first and second transistors being connected to said third and fourth terminals, respectively, said gate electrodes being connected to said first terminal, and said drain electrodes being connected to said second terminal, said first and second transistors being quiescently biased such that both are in saturation, the improvement comprising:

first voltage dependent variable conductance means continuously connected between said second and third terminals, said first means for conducting current therebetween in the same relative sense as said first transistor and having a conductance which increases as the potential difference between said second and third terminals increases; and second voltage dependent variable conductance means continuously connected between said second and fourth terminals, said second means for conducting current therebetween in the same relative sense as said second transistor and having a conductance which increases as the potential difference between said second and fourth terminals increases.

2. The amplifier as set forth in claim 1 wherein said first and second variable conductance means comprises third and fourth field effect transistors, respectively, the gate electrode of each being connected to the drain electrode thereof, the drain-to-source path of said third transistor being connected between said second and third terminals and the drain-to-source path of said fourth transistor being connected between said second and fourth terminals.

3. The amplifier as set forth in claim 2 wherein said third and fourth field-effect transistors have conduction paths of complementary conductivity types.

4. The amplifier as set forth in claim 2 wherein said third and fourth field-effect transistors have conduction paths of non-complementary conductivity types.

5. An amplifier, comprising, in combination:

first, second, third and fourth terminals, said first terminal for receiving an input signal to be amplified, said second terminal for providing an output signal, said third and fourth terminals for receiving a direct current operating potential thereacross;

first and second complementary field effect transistors, each having source, gate and drain electrodes, said gate electrodes being connected to said first terminal, said drain electrodes being directly connected to said second terminal, said source electrodes being connected to separate ones of said third and fourth terminals;

a third field effect transistor having a conduction channel and a gate electrode, said conduction channel being connected between said second and third terminals, said gate electrode being connected to a selected one of said second and third terminals for receiving turn-on bias; and a fourth field effect transistor having a conduction channel and a gate electrode, said conduction channel being connected between said second and fourth terminals, said gate electrode being connected to a selected one of said second and fourth terminals for receiving turn-on bias.

6. The amplifier recited in claim 5 wherein said third and fourth field-effect transistors are complementary.

7. The amplifier recited in claim 5 wherein said third and fourth field-effect transistors are non-complementary.

8. In combination:

a complementary field effect transistor amplifier having an input terminal, an output terminal and two operating potential supply terminals;

a first diode-connected field effect transistor connected between said output terminal and one of said supply terminals;

a second diode-connected field effect transistor connected between said output terminal and the other of said supply terminals; and wherein each said diode-connected field effect transistor is poled in a sense to be forward biased upon application of an operating potential across said supply terminals thereby providing a voltage dependent load impedance for said amplifier which decreases as said operating potential increases.

9. The combination recited in claim 8 wherein said first and second diode-connected field-effect transistors are complementary enhancement-mode field effect transistors.

10. The combination recited in claim 8 wherein said first and second diode-connected field effect transistors are non-complementary enhancement-mode field effect transistors.

* * * * *